United States Patent [19]

Sypek et al.

[11] Patent Number: 5,543,262
[45] Date of Patent: Aug. 6, 1996

[54] BENZANTHRONE POLYMERIZATION GATE IN PHOTOPOLYMERIZABLE COMPOSITIONS

[75] Inventors: Maria T. Sypek; John R. Delude, both of Belchertown; Paul A. Perron, Springfield, all of Mass.

[73] Assignee: International Paper Company, Purchase, N.Y.

[21] Appl. No.: 393,969

[22] Filed: Feb. 24, 1995

[51] Int. Cl.$^6$ .............. G03F 7/016; G03F 7/09; G03F 7/30
[52] U.S. Cl. .......... 430/162; 430/281.1; 430/175; 430/171; 430/283.1; 430/285.1; 430/272.1; 430/278.1; 430/271.1; 430/325; 430/916; 430/918; 430/917; 430/923; 430/920; 430/922; 430/921; 430/919; 522/12; 522/25; 522/26; 522/27; 522/28; 522/29; 522/30; 522/89
[58] Field of Search ............... 430/281, 175, 430/171, 283, 285, 162, 272, 278, 271, 325, 916, 918, 917, 923, 920, 922, 921, 919, 281.1, 283.1, 285.1, 272.1, 278.1, 271.1; 522/12, 25, 26, 27, 28, 29, 30, 89

[56] References Cited

U.S. PATENT DOCUMENTS

| | | |
|---|---|---|
| 3,661,588 | 5/1972 | Chang ..................... 96/86 P |
| 4,048,036 | 9/1977 | Prucnal ..................... 522/27 X |
| 4,367,280 | 1/1983 | Kondo et al. ............... 430/281 |
| 4,386,153 | 5/1983 | Shinozaki, et al. ......... 430/285 |
| 4,565,857 | 1/1986 | Grant ....................... 522/89 X |
| 4,946,373 | 8/1990 | Walls et al. ............... 430/300 |
| 5,080,999 | 1/1992 | Imai et al. ................ 430/175 |

FOREIGN PATENT DOCUMENTS 61-123602  6/1986  Japan ........................ 522/26

Primary Examiner—Cynthia Hamilton
Attorney, Agent, or Firm—Richard S. Roberts; Michael J. Doyle

[57] ABSTRACT

A light sensitive composition which is capable of photopolymerization which includes a photopolymerizable compound a free radical generating component and a benzanthrone or substituted benzanthrone which substantially prevents photopolymerization when the light sensitive composition is exposed to actinic radiation below a threshold amount but permits photopolymerization when the light sensitive composition is exposed to actinic radiation above a threshold amount. This achieves a gate effect which eliminates or decreases unwanted partial exposure in the nonimage areas and hence improves reproduction quality.

20 Claims, No Drawings

1

BENZANTHRONE POLYMERIZATION GATE IN PHOTOPOLYMERIZABLE COMPOSITIONS

BACKGROUND OF THE INVENTION

1. Field of the Invention

The invention pertains to photopolymerizable compositions and photographic elements containing such photopolymerizable compositions. More particularly, the invention pertains to photopolymerizable compositions including a benzanthrone component which improves the reproduction quality of photographic elements using the composition. These elements are useful as lithographic printing plates.

2. Description of the Prior Art

It is well known that lithographic printing plates may be formed by coating a photopolymerizable composition onto a substrate such as a hydrophilic aluminum or treated aluminum substrate. Exemplary photopolymerizable compositions are disclosed in U.S. Pat. Nos. 5,061,605 and 5,286,594 which are incorporated herein by reference.

A photopolymerizable composition typically contains a radical generator component such as a photoinitiator, a photopolymerizable monomer or oligomer as well as binders, colorants and other art recognized ingredients. Upon exposure to ultraviolet or actinic radiation through a photomask, the photoinitiator generates free radicals which initiates the polymerization of the monomer or oligomer in the light struck image areas. Unexposed coating areas are then removed by a developing solution resulting in an image of exposed, oleophilic photopolymer against a background of a hydrophilic substrate.

One problem with such plates is out of contact exposure in the intended nonimage areas. The photomask is employed to differentiate between the areas which are intended to be exposed to radiation and those which are to be masked from such exposure. However, the masked areas are often in the form of minute halftone dots of varying size. In practice, there tends to be some minor degree of unwanted exposure in the nonimage areas due to light scattering, diffusion, imperfect mask to plate contact, and other diverse reasons. This causes an unwanted partial exposure in the nonimage areas and hence a background staining due to halations and hotspots. Halations and hotspots are a serious problem in commercial printing applications since they cause degradation of the reproduction quality of halftone images. Those skilled in the art have attempted a variety of solutions to this problem including the selection of photopolymerizable compositions requiring high exposure doses and the use of exposure filters. Such have well known disadvantages. It would be desirable to produce a photopolymerizable composition which can more adequately differentiate between the image and non-image areas by permitting full effective photopolymerization in the unmasked image areas intended to be exposed to actinic radiation while impeding photopolymerization in the masked nonimage areas which are not intended to be exposed. The present invention achieves this purpose by inclusion of a small amount of benzanthrone or a benzanthrone derivative within the photopolymerizable composition. The benzanthrone acts as a polymerization gate or switch. In the unmasked areas which are to receive a full measure of exposure beyond a certain threshold level, photopolymerization proceeds effectively as if no benzanthrone were present. However, in areas receiving a partial exposure to such radiation, i.e. below a threshold level, via light scattering or flare, the benzanthrone impedes unwanted polymerization. Without being limited to a particular theory, it is believed that the benzanthrone acts to prevent or limit polymerization in the masked areas where it receives relatively low exposure doses, but is essentially ineffective for this purpose and is overwhelmed by large exposure doses in the unmasked areas. The result is a photographic element having improved image-nonimage differentiation. Reproduction quality is improved, hotspots and halations caused by out of contact exposure are reduced without reduction in the extent of desired photopolymerization. In photopolymerizable compositions to which small quantities of benzanthrone have been added, exposure to actinic radiation below a threshold level results in substantially no polymerization. However, when exposure exceeds the threshold level, photopolymerization proceeds as if no benzanthrone were present. While it is known from U.S. Pat. Nos. 4,367,280 and 4,386,153 to use benzanthrones as photoinitiators, they have not been known heretofore known as photopolymerization gates in compositions using other components as photoinitiators.

SUMMARY OF THE INVENTION

The invention provides a light sensitive composition which is capable of photopolymerization upon exposure to sufficient actinic radiation which comprises:

(a) at least one photopolymerizable compound having at least two olefinically unsaturated double bonds, which photopolymerizable compound is present in an amount sufficient to photopolymerize in the presence of a free radical generating component which is capable of photoinitiation upon exposure to sufficient actinic radiation; and (b) at least one free radical generating component which is capable of photoinitiation, in an amount sufficient to effect photopolymerization of the photopolymerizable compound upon exposure to sufficient actinic radiation; and (c) at least one compound selected from the group consisting of benzanthrone and benzanthrone substituted with one or more halogen atoms, alkyl groups having 1 to about 5 carbon atoms, and alkoxy groups having 1 to about 5 carbon atoms, in an amount sufficient to substantially prevent photopolymerization of the photopolymerizable compound when the light sensitive composition is exposed to actinic radiation below a threshold amount but to permit photopolymerization of the photopolymerizable compound when the light sensitive composition is exposed to actinic radiation above a threshold amount.

The invention also provides a photographic element comprising a substrate and the above composition disposed on the substrate, as well as a method for the use of such composition.

DETAILED DESCRIPTION OF THE PREFERRED EMBODIMENT

The composition of the invention comprises at least one photopolymerizable compound, which may be a monomer, oligomer or polymer having at least two olefinically unsaturated double bonds. Such are well known in the art. Suitable for use as polymerizable components are ethers, esters and partial esters of acrylic and methacrylic acid and aromatic and aliphatic polyols containing preferably 2 to 30 carbon atoms, or cycloaliphatic polyols containing preferably 5 or 6 ring carbon atoms. These polyols can also be modified with epoxides such as ethylene oxide or propylene oxide. The partial esters and esters of polyoxyalkylene glycols are also suitable. Examples are ethylene glycol dimethacrylate, diethylene glycol dimethacrylate triethylene glycol dimethacrylate, tetraethylene glycol dimethacrylate, polyethylene glycol dimethacrylates having an average molecular weight in the range from 200 to 2000, ethylene glycol diacrylate, diethylene glycol diacrylate, triethylene glycol diacrylate, tetraethylene glycol diacrylate, polyethylene glycol diacrylates having an average molecular weight in the range from 200 to 2000, trimethylolpropane ethoxylate trimethacrylate, trimethylolpropane polyethoxylate trimethacrylates having an average molecular weight in the range from 500 to 1500, trimethylolpropane ethoxylate triacrylates having an average molecular weight in the range from 500 to 1500, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexaacrylate, tripentaerythritol octaacrylate, pentaerythritol dimethacrylate, pentaerythritol trimethacrylate, dipentaerythritol dimethacrylate, dipentaerythritol tetramethacrylate, tripentaerythritol octamethylacrylate, 1,3-butanediol dimethacrylate, sorbitol triacrylate, sorbitol tetraacrylate, sorbitol tetramethacrylate, sorbitol pentaacrylate, sorbitol hexaacrylate, oligoester acrylates, oligoester methacrylates, glycerol di- and triacrylate, 1,4-cyclohexane diacrylate, bisacrylates and bismethacrylates of polyethylene glycols having an average molecular weight from 100 to 1500, ethylene glycol diallyl ether, 1,1,1-trimethylolpropane triallyl ether, pentaerythritol triallyl ether, diallyl succinates and diallyl adipates or mixtures of the above compounds. Preferred multifunctional acrylate oligomers include, but are not limited to acrylated epoxies such as Interez Corporation's Novacure 3701, acrylated polyurethanes such as Sartomer Co.'s C9505, and acrylated polyesters such as Henkel Corp.'s Photomer 5007. Preferred photopolymerizable polymers include, but are not limited to acrylamido substituted cellulose acetate butyrate and cellulose acetate proprionate available from Bomar; acrylated epoxies available from Echo Resins; acrylated polyesters; acrylated polyethers and acrylated urethanes. A preferred photopolymerizable polymer is Jaylink 106E which is an acrylamido modified cellulose acetate butyrate polymer manufactured by Bomar Specialties. Such are described in U.S. Pat. Nos. 4,557,951 and 4,490,516 which are incorporated herein by reference. These describe a polymerizable cellulosic ester or ether product capable of homopolymerization or co-polymerization with vinyl monomers. They have a degree of substitution of between 2.0 and 2.9 reacted with an acrylamide reactant containing a methylol group to provide a degree of substitution of from about 0.05 to about 0.5 and to provide a degree of hydroxyl substitution of from about 0.05 to about 0.5. Another preferred photopolymerizable component is Sartomer 9041 which is a pentaacrylate ester manufactured by Sartomer. The photopolymerizable compound is present in an amount sufficient to photopolymerize upon exposure to sufficient actinic radiation. In the preferred embodiment, the multifunctional photopolymerizable compound is present in the overall composition in an amount of from about 1% to about 80% by weight, preferably from about 20% to about 70% based on the non-solvent parts of the overall composition.

The composition further comprises at least one free radical generating component which photolytically generates free radicals. Examples of free radical generating components include photoinitiators which themselves photolytically generate free radicals by a fragmentation or Norrish type 1 mechanism. These latter have a carbon-carbonyl bond capable of cleavage at such bond to form two radicals, at least one of which is capable of photoinitiation. Suitable initiators include aromatic ketones such as benzophenone, acrylated benzophenone, 2-ethylanthraquinone, phenanthraquinone, 2-tert-butylanthraquinone, 1,2-benzanthraquinone, 2,3-benzanthraquinone, 2,3-dichloronaphthoquinone, benzyl dimethyl ketal and other aromatic ketones, e.g. benzoin, benzoin ethers such as benzoin methyl ether, benzoin ethyl ether, benzoin isobutyl ether and benzoin phenyl ether, methyl benzoin, ethyl benzoin and other benzoins; diphenyl-2,4,6-trimehtyl benzoylphosphine oxide; bis(pentafluorophenyl)titanocene;

The free radical generating component may comprise a combination of radical generating initiators which generate free radicals by a Norrish type 1 mechanism and a spectral sensitizer. Such a combination includes 2-methyl-1-[4-(methylthiophenyl]-2-morpholinopropanone available from Ciba Geigy as Irgacure 907 in combination with ethyl Michler's ketone (EMK) which is 4,4'-bisdiethylaminobenzophenone; Irgacure 907 in combination with 2-isopropylthioxanthanone (ITX); benzophenone in combination with EMK; benzophenone in combination with ITX; 2-benzyl-2-N,N-dimethylamino- 1-(4-morpholinophenyl)-1-butanone which is available from Ciba-Geigy as Irgacure 369 in combination with EMK; Irgacure 369 in combination with ITX. In such cases, it is preferred that the weight ratio of radical generating photoinitiator and spectral sensitizer ranges from about 5:1 to about 1:5.

Other radical generators useful for this invention nonexclusively include triazines, such as chlorine radical generators such as 2-substituted-4,6-bis(trihalomethyl)-1,3,5-triazines. The foregoing substitution is with a chromophore group that imparts spectral sensitivity to the triazine to a portion of the electromagnetic radiation spectrum. Non-exclusive examples of these radical generators include 2-(4-methoxynaphth-1-yl)-4,6-bis(trichloromethyl)-1,3,5,-triazine which is available commercially from PCAS, Longjumeau Cedex (France) as Triazine B; 2-(4-methylthiophenyl)-4,6-bis(trichloromethyl)-1,3,5,-triazine; 2-(4-methoxystyryl)-4,6-bis(trichloromethyl)-1,3,5-triazine; 2-(4-diethylaminophenyl-1,3-butadienyl)-4,6-bis(trichloromethyl)-1,3,5-triazine, among others. Also useful for the invention are Norrish type II mechanism compounds such as combinations of thioxanthones such as ITX and a source of abstractable hydrogen such as triethanolamine.

The free radical generating component is present in an amount sufficient to effect photopolymerization of the photopolymerizable compound upon exposure to sufficient actinic radiation. The photoinitiator may comprise from about 1% to about 50% of the non-solvent parts of the overall composition, or more preferably from about 2% to about 40% and most preferably from about 5% to about 25%.

The composition further comprises at least one compound selected from the group consisting of benzanthrone and benzanthrone substituted with one or more halogen atoms, alkyl groups having 1 to about 5 carbon atoms, and alkoxy groups having 1 to about 5 carbon atoms. Unsubstituted benzanthrone is most preferred. The benzanthrone or substituted benzanthrone is present in an amount sufficient to substantially prevent photopolymerization of the photopolymerizable compound when the light sensitive composition is exposed to actinic radiation below a threshold amount but to permit photopolymerization of the photopolymerizable compound when the light sensitive composition is exposed to actinic radiation above the threshold amount. The benzanthrone or substituted benzanthrone may comprise from about 0.1% to about 15% by weight of the non-solvent parts of the overall composition, or more preferably from about 0.5% to about 10% and most preferably from about 1% to about 5%. The light sensitive composition optionally includes a light sensitive diazonium compound such as a light sensitive diazonium polymer. Such diazonium polymers are well known to the skilled artisan and may be formed by condensing a diazonium monomer with a condensing agent in an acidic medium and isolating the condensation product with an anion. Suitable diazonium compounds include those condensed with formaldehyde such as disclosed in U.S. Pat. Nos. 2,063,631 and 2,667,415, the polycondensation products such as disclosed in U.S. Pat. Nos. 3,849,392 and 3,867,147, and the high photo-speed and co-condensed diazos such as disclosed in U.S. Pat. Nos. 4,436,804 and 4,533,620. A useful diazonium is the polycondensation product of 3-methoxy-4-diazo-diphenyl amine sulfate and 4,4'-bismethoxy-methyl-diphenyl ether, precipitated as the mesitylene sulfonate, such as is taught in U.S. Pat. No. 3,849,392 and which is incorporated herein by reference. Typical diazo compounds are disclosed on pages 194–214 and 321–330 of the volume "Light Sensitive Systems" by Jaromir Kosar, John Wiley & Sons, Inc., New York, 1965. Suitable light sensitive diazonium polymers are isolated as the salts of the condensation product of a suitable monomeric diazonium or mixture of monomeric diazoniums with a suitable condensing agent and which condensed in strong acid. Examples of suitable monomeric diazoniums include but are not limited to p-diazodiphenylamine sulfate; 3-methoxy-4-diazodiphenylamine sulfate; 4-diazo-4'-methoxydiphenylamine sulfate; 2,5-diethoxy-4-diazo-4'-thiotolyl sulfate and combinations thereof. Examples of suitable condensing agents include but are not limited to formaldehyde; paraformaldehyde; 4,4-bismethoxymethyldiphenylether; 4,4-bishydroxymethyldiphenylether; 4,4'-bismethoxymethyldiphenylsulfide; 4,4'-bismethoxymethyl bisphenol A and combinations thereof. Examples of suitable condensing acids include but are not limited to sulfuric acid, phosphoric acid, trifluoromethyl sulfonic acid and nitric acid. Examples of suitable salt anions used to isolate the condensation products include but are not limited to p-toluenesulfonate, hexafluorophosphate, tetrafluoroboride, mesitylenesulfonate, and trifluoromethylsulfonate. The most preferred diazonium compound is DSO-19 which is the condensation product of 4-diazodiphenylaminesulfate and formaldehyde isolated as the p-toluenesulfonate and is manufactured by PCAS. The diazonium polymer, when one is used, is present in an amount sufficient to form a light sensitive composition which is substantially sensitive to actinic radiation in the range of from about 300 to about 550 nm. It preferably may comprise from about 0.5% to about 25% of the non-solvent parts of the overall composition, or more preferably from about 1% to about 15% and most preferably from about 5% to about 10%.

In the preferred embodiment, the composition may also contain a polymeric binder to bind the other components into a substantially uniform mixture which can be applied to a substrate. Examples of suitable binders non-exclusively include gelatin, polyvinyl alcohol, polyvinylalcohol copolymers, polyvinyl butyral, acrylic ester polymers and copolymers; polyacrylic acid, polymethacrylic acid, polyethylene oxide, ethylcellulose, polyesters, polystyrene, polyacrylic acid esters, polymethacrylic acid esters, polyvinyl acetal, polyamides, polyacrylonitrile, polyethylene halogenated polyolefins, chlorinated rubber ethylcellulose, cellulose acetate, cellulose nitrate and other homopolymers; and copolymers prepared from various kind of vinyl compounds such as polyvinylacetate and copolymers of polyvinylacetate, polyvinylchloride and copolymers; polyvinylidene chloride polymers and copolymers; vinyl chloride-vinyl acetate copolymer, and styrene-butadiene copolymer. The amount of the binder can be experimentally varied by one skilled in the art depending on the desired product characteristics, however they typically comprise from about 1 to about 50% and preferably from about 5 to about 30% of the overall composition by weight.

Colorants, such as dyes and organic and inorganic pigments are commonly used to impart color to coatings. Color is a desired characteristic of a photosensitive coating for printing plates. The color allows inspection of the printing plate for coating defects and uniformity of the coating before use. After the plate is imagewise exposed and the unexposed coating is removed by development, color in the exposed coating remaining on the plate provides visible discrimination between exposed, imaged areas of the plate and the unexposed, non-imaged areas of the plates. However care should be taken to avoid certain dyes and pigments known in the art to exert a desensitization effect upon light sensitive compositions.

Useful colorants non-exclusively include dyes such as Rhodamine, Chalcozine, Victoria Blue and methyl violet and pigments such as the anthraquinone and phthalocyanine types. Perylene maroon, phthalo cyanine blue, phthalo cyanine green and cadmium red are similarly useful. Generally, the colorant is in the form of a pigment dispersion which comprises a mixture of one or more pigments dispersed in a suitable dispersant. The pigment will comprise about 20 to about 80% of the pigment dispersion, preferably about 40 to about 60%. Examples of suitable dispersants to be used include but are not limited to polyvinylbutyral, polyvinylformal, cellulose esters, polyurethanes and epoxies. The dispersant will comprise 20 to 80% of the pigment dispersion, preferably 40 to 60%. A preferred colorant is 79S26C chip which is a dispersion of 60% phthalocyanine blue pigment (Pigment Blue 15:4) in Monsanto Butvar B-98 (polyvinylbutyral polymer) and is available commercially from Penn Color Inc. The 79S26C chip produces a blue color in the photocoat. Such dispersions are described in U.S. Pat. No. 5,286,594 which is incorporated herein by reference. A suitable amount of the colorant which can be used ranges from about 0.01% to about 25%, preferably 0.1% to 15%, by weight based on the weight of the composition excluding solvents of this invention. Another preferred component is an exposure indicator such as metanil yellow (phenylazodiphenylamine, 4-sulfonic acid sodium salt). This is a pH sensitive dye which produces a dye image in conjunction with the acid produced by the diazonium.

The components of the above composition may be combined by mixing them together in a suitable solvent medium. Solvents which can be used in preparing the photopolymerizable composition of this invention include 1,2-dichloroethane, alcohols such as methanol, ethanol, propanol and butanol; ketones such as acetone, methyl ethyl ketone, methyl isobutyl ketone, cyclohexanone, diisobutyl ketone, etc., esters such as ethyl acetate, butyl acetate, amyl acetate, methyl formate, ethyl propionate, dimethyl phthalate, ethyl benzoate and methyl Cellosolve acetate; aromatic hydrocarbons such as toluene, xylene, benzene, ethylbenzene; halogenated hydrocarbons such as carbon tetrachloride, trichloroethylene, chloroform, 1,1,1-trichloroethane, 1,2-dichloroethane, monochlorobenzene, chloronaphthalene;

ethers such as tetrahydrofuran, diethyl ethers ethylene glycol monoethyl ether acetate, ethylene glycol monomethyl ether, etc., dimethylformamide, dimethyl sulfoxide, etc., and mixtures thereof. The most preferred solvents are ethyleneglycol monomethylether, ethyleneglycol monoethylether and dimethyl formamide which dissolve the other components of the photographic coating. A suitable amount of the solvent which can be employed in the photopolymerizable composition of this invention ranges from about 50% to about 1,000%, preferably 70% to 500%, by weight of the total non-solvent parts of the composition.

Various optional additives may be added to the composition depending on the purpose of the end-use of the light-sensitive composition, and other various conditions. Examples of these include thermal polymerization inhibitors, plasticizers and others.

Specific examples of suitable thermal polymerization inhibitors include hydroquinone, hydroquinone monomethyl ether, catechol, beta-naphthol, mono-t-butylhydroquinone, pyrogallol, 4-tert-butylphenol, 2,5-di-tert-butylhydroquinone or 2,6-di-tertbutyl-4-methylphenol. A suitable amount of the thermopolymerization inhibitor which can be used ranges from about 0.01% to about 5%, preferably 0.1% to 3%, by weight, based on the weight of the non-solvent parts of the composition.

Examples of suitable plasticizers include dioctyl phthalate, dibutyl phthalate, butyl phthalyl, butyl glycolate, tricresyl, phosphate, polyester series plasticizers and chlorinated paraffins. A suitable amount of the plasticizer can range from about 0.1% to about 20%, preferably 1% to 10%, by weight based on the weight of the non-solvent parts of the composition.

In order to construct the photographic elements of the present invention, the light sensitive composition is coated onto a suitable substrate and dried. Suitable substrates include aluminum alloys, silicon and polymeric film bases such as polyethylene terephthalate and cellulose acetate butyrate. The most preferred substrate is a lithographic grade aluminum alloy which may have had art recognized surface treatments performed on it. When such is the case, a sheet metal substrate, preferably aluminum and the alloys thereof especially those aluminum compositions suitable for the manufacture of lithographic printing plates such as Alcoa 3003 and Alcoa 1100, which may or may not have been pre-treated by standard techniques as are well known in the art, may be treated by spraying, brushing, dipping or other means with a composition suitable for use as a hydrophilizing interlayer for lithographic plates. Standard metal substrate pretreatments include chemical etching, chemical, electrochemical or mechanical graining and anodizing by methods which are known to the skilled worker. A grain may be imparted to the aluminum surface by wire brushing or a pumice slurry or electrochemically grained in nitric acid followed by desmutting. Anodizing may be performed by electrolytically treating the coated substrate in an aqueous solution of sulfuric, chromic, or phosphoric acid having a concentration of from about 0.5 to 25% by weight of acid in water. Anodizing preferably takes place in a bath maintained at a temperature of from about 15° C. to 35° C. for about from 1 to about 20 minutes at about from 5 to 20 volts and at a current density of about from 10 to 70 amperes per square foot. The foregoing techniques are well known in the art.

The substrate may be treated with an aqueous solutions of a hydrophilizing compound such as alkali silicate, silicic acid, the Group IV-B metal fluorides, the alkali metal salts, polyvinyl phosphonic acid, polyacrylic acid, the alkali zirconium fluorides, such as potassium zirconium hexafluoride, or hydrofluozirconic acid in concentrations of 0.5 to 20% by volume. A preferred concentration range is from 3 to 8% and the most preferred range is from 4 to 5%.

Next, the light sensitive composition of this invention may be coated onto the substrate and dried. The coating is preferably applied to a properly prepared lithographic plate substrate by any well known coating technique and the solvents are evaporated to yield a dry coating weight of 0.70±0.05 grams per square meter.

The thusly produced photographic element may then be exposed to ultraviolet or actinic radiation, such as in the 300 to 550 nanometer range through a photographic mask and developed. Suitable uv light sources are carbon arc lamps, xenon arc lamps, mercury vapor lamps which may be doped with metal halides (metal halide lamps), fluorescent lamps, argon filament lamps, electronic flash lamps and photographic floodlight lamps. Exposure is conducted to provide sufficient actinic energy to the element to permit photopolymerization of the photopolymerizable compound in the image areas where the light sensitive composition is exposed through a mask and yet substantially prevent photopolymerization of the photopolymerizable compound in the nonimage areas. The nonimage areas are then removed with a suitable developer.

Typical developer compositions can be alkaline or neutral in nature and have a pH range of from about 5 to about 9. Developers are preferably formed from aqueous solutions of phosphates, silicates or metabisulfites. Such non-exclusively include mono-, di- and tri- alkali metal phosphate, sodium silicate, alkali metal metasilicate and alkali metabisulfite. Alkali metal hydroxides may also be used although these are not preferred. The developers may also contain art recognized surfactants, buffers and other ingredients.

The following non-limiting examples will serve to illustrate the invention. It will be appreciated that variations in proportions and alternatives in elements of the components of the photosensitive coating composition will be apparent to those skilled in the art and are within the scope of the present invention.

EXAMPLES

The compositions of the following examples are prepared by dissolving the components in the indicated solvents. Each composition is then coated onto mechanically and electrochemically grained, anodized, post anodically hydrophilized aluminum alloy substrates. They are dried for 90 seconds at 70° C. to produce lithographic printing plates with a dry coating weight of 0.70±0.05 grams per square meter. The plates are exposed for 17.5 units on a Teaneck vacuum frame equipped with an Olec Al83 light unit containing an Olec 1282 multispectrum lamp. The plates are developed with Anitec SP plate developer in an Anitec SN 32 plate processor.

EXAMPLE 1 (COMPARATIVE)

| Component | % by Weight |
| --- | --- |
| ethyleneglycol monomethyl ether | 61.87 |
| ethyleneglycol monoethyl ether | 18.30 |
| dimethyl formamide | 15.32 |
| Jaylink 106E | 0.56 |
| Sartomer 9041 | 1.95 |

-continued

| Component | % by Weight |
|---|---|
| Irgacure 907 | 0.60 |
| ethyl Michler's ketone | 0.24 |
| metanil yellow | 0.11 |
| 79S26C chip | 0.68 |
| DSO-19 | 0.37 |
|  | 100.00 |

EXAMPLE 1

0.08 parts by weight of benzanthrone are added to the composition of Comparative Example 1.

EXAMPLE 2 (COMPARATIVE)

| Component | % by Weight |
|---|---|
| ethyleneglycol monomethyl ether | 62.41 |
| ethyleneglycol monoethyl ether | 18.30 |
| dimethyl formamide | 15.32 |
| Jaylink 106E | 0.56 |
| Sartomer 9041 | 1.95 |
| Triazine B | 0.30 |
| metanil yellow | 0.11 |
| 79S26C chip | 0.68 |
| DSO-19 | 0.37 |
|  | 100.00 |

EXAMPLE 2

0.08 parts by weight of benzanthrone are added to the composition of Comparative Example 2.

RESULTS

Exposure through a Stouffer 21-step exposure guide produces a solid step 5 on all plates. The plates of Comparative Example 1 and Comparative Example 2 produce ghost step 13, while the plates of Examples 1 and 2 produce ghost step 10. Solvent resistance is measured as per the test described in the examples of U.S. Pat. No. 5,286,594 which is incorporated herein by reference. By this test, benzyl alcohol is poured directly in the imaged and developed plate. After five seconds the imaged and developed plate is given 20 vigorous back and forth rubs with a wipe saturated with benzyl alcohol. All plates show a 1 step loss indicating good solvent resistance and therefore a good extent of photopolymerization. The addition of benzanthrone in Example 1 and Example 2 does not cause any loss in solvent resistance. Exposure through a 50% 150 line screen is performed to qualitatively measure halations and hotspots. The quality of the screen reproduced on each plate is compared to the screen and a number assigned to the reproduction quality. The plate of Comparative example 1 is rated $2^+/3$ while the plate of Example 1 is rated $1/1^+$. The plate of Comparative Example 2 is rated 2 while the plate of Example 2 is rated 1. The improved reproduction quality of Example 1 and Example 2 relative to Comparative Example 1 and Comparative Example 2 demonstrates the effect of the addition of benzanthrone on qualitative reproduction quality.

Exposure through a Fogra Contact Control Strip KKS is done to quantitatively measure the effect of out of contact exposure. The KKS strip measures the ability of a plate to reproduce 50 micrometer concentric lines at increasing out of contact exposure. Target 1 on the KKS strip employs a 75 micrometer spacer between the plate and 50 micrometer concentric line target. The spacer is increased to 150 micrometers on Target 2 and 225 micrometers on Target 3. Each target on the KKS strip is read through an 8X or 30X magnifier and the number of the concentric circle where the 50 micrometer lines are reproduced is read. The higher the number, the worse the out of contact exposure has affected reproduction. Results for the forgoing examples are as follows:

TABLE

| PLATE | TARGET 1 | TARGET 2 | TARGET 3 |
|---|---|---|---|
| Comparative Example 1 | 21 | 38 | >40 |
| Example 1 | 0 | 19 | 23 |
| Comparative Example 2 | 15 | 27 | 33 |
| Example 2 | 0 | 7 | 14 |

The improved reproduction quality at out of contact exposure for the plates of Examples 1 and 2 relative to Comparative Examples 1 and 2 demonstrates the effect of benzanthrone on improving reproduction quality.

COMPARATIVE EXAMPLE 3

Phenothiazine, a known radical trap was added to the composition of Comparative Example 1. At a level of 1000 parts per million of total coating solids, no loss in solvent resistance is observed. However, no improvement in hotspots or halations, as measured by a 50% 150 line screen is observed. At a level of 5000 ppm, no improvement in hotspots or halations is noticed and yet a loss in solvent resistance (2 to 3 step loss) is observed. The addition of phenothiazine does not produce the same effect as the addition of benzanthrone.

What is claimed is:

1. A light sensitive composition which is capable of photopolymerization upon exposure to sufficient actinic radiation which comprises:

(a) at least one photopolymerizable compound having at least two olefinically unsaturated double bonds, which photopolymerizable compound is present in an amount sufficient to photopolymerize in the presence of a free radical generating component which is capable of photoinitiation upon exposure to sufficient actinic radiation; and (b) at least one free radical generating component which is capable of photoinitiation, in an amount sufficient to effect photopolymerization of the photopolymerizable compound upon exposure to sufficient actinic radiation; and (c) benzanthrone in an amount sufficient to substantially prevent photopolymerization of the photopolymerizable compound when the light sensitive composition is exposed to actinic radiation below a threshold amount but to permit photopolymerization of the photopolymerizable compound when the light sensitive composition is exposed to actinic radiation above a threshold amount; and (d) at least one light sensitive diazonium compound.

2. The light sensitive composition of claim 1 wherein the at least one light sensitive diazonium compound is formed by condensing a diazonium monomer with a condensing agent and isolating the condensation product with an anion, which diazonium compound is present in an amount sufficient to form a light sensitive composition which is substantially sensitive to actinic radiation in the range of from about 300 to about 550 nm.

3. The light sensitive composition of claim 2 wherein the diazonium compound is the condensation product of 4-diazodiphenylaminesulfate and formaldehyde isolated as the p-toluenesulfonate.

4. The light sensitive composition of claim 1 wherein the photopolymerizable compound comprises one or more components selected from the group consisting of ethers, esters and partial esters of acrylic and methacrylic acid with an aromatic or aliphatic polyol.

5. The light sensitive composition of claim 1 wherein the photopolymerizable compound comprises one or more components selected from the group consisting of an acrylamido modified cellulose acetate butyrate polymer and a pentaacrylate ester.

6. The light sensitive composition of claim 1 wherein the free radical generator comprises one or more compounds selected from the group consisting of photoinitiators which photolytically generate free radicals and have a carbon-carbonyl bond capable of cleavage at such bond to form two radicals, at least one of which is capable of photoinitiation; and a combination of a radical generating initiator which generates free radicals in combination with a spectral sensitizer.

7. The light sensitive composition of claim 1 wherein the free radical generator comprises one or more compounds selected from the group consisting of aromatic ketones, benzoin, benzoin ethers, diphenyl-2,4,6-trimethyl benzoylphosphine oxide; bis(pentafluorophenyl)titanocene; triazines; and thioxanthones in combination with a source of abstractable hydrogen.

8. The light sensitive composition of claim 1 wherein the free radical generator is a 2-substituted-4,6-bis(trihalomethyl)-1,3,5-triazine wherein the substitution is with a chromophore group.

9. The light sensitive composition of claim 1 wherein the free radical generator comprises one or more compounds selected from the group consisting of 2-methyl-1-[4-(methylthiophenyl]-2-morpholinopropanone; 2-benzyl-2-N,N-dimethylamino-1-(4 -morpholinophenyl)-1-butanone and benzophenone; in combination with one or more compounds selected from the group consisting of 2-isopropylthioxanthanone and 4,4'-bisdiethylaminobenzophenone.

10. The light sensitive composition of claim 9 wherein the photopolymerizable compound comprises one or more components selected from the group consisting of an acrylamido modified cellulose acetate butyrate polymer and a pentaacrylate ester.

11. The light sensitive composition of claim 1 wherein the photopolymerizable compound is present in an amount of from about 1% to about 80%, the photoinitiator is present in an amount of from about 1% to about 50%, and the benzanthrone is present in an amount of from about 0.1% to about 15%, and the diazonium compound is present in an amount of from about 0.5% to about 25% by weight of the non-solvent parts of the light sensitive composition.

12. The light sensitive composition of claim 1 further comprising one or more components selected from the group consisting of binders, colorants, solvents, thermal polymerization inhibitors and plasticizers.

13. A photosensitive element which comprises a substrate and a light sensitive composition on the substrate, which light sensitive composition comprises a light sensitive composition which is capable of photopolymerization upon exposure to sufficient actinic radiation which comprises:

(a) at least one photopolymerizable compound having at least two olefinically unsaturated double bonds, which photopolymerizable compound is present in an amount sufficient to photopolymerize in the presence of a free radical generating component which is capable of photoinitiation upon exposure to sufficient actinic radiation; and (b) at least one free radical generating component which is capable of photoinitiation, in an amount sufficient to effect photopolymerization of the photopolymerizable compound upon exposure to sufficient actinic radiation; and (c) benzanthrone in an amount sufficient to substantially prevent photopolymerization of the photopolymerizable compound when the light sensitive composition is exposed to actinic radiation below a threshold amount but to permit photopolymerization of the photopolymerizable compound when the light sensitive composition is exposed to actinic radiation above a threshold amount; and (d) at least one light sensitive diazonium compound.

14. The photosensitive element of claim 13 wherein the substrate comprises a component selected from the group consisting of aluminum alloys, silicon and polymeric film bases.

15. The photosensitive element of claim 14 wherein the substrate comprises an aluminum alloy and the surface of the substrate has been pretreated before coating the light sensitive composition, with one or more processes selected from the group consisting of chemical etching, chemical graining, electrochemical graining, mechanical graining, anodizing and hydrophilizing.

16. The photosensitive element of claim 15 wherein the photopolymerizable compound comprises one or more components selected from the group consisting of ethers, esters and partial esters of acrylic and methacrylic acid with an aromatic or aliphatic polyol; and wherein the free radical generator comprises one or more compounds selected from the group consisting of photoinitiators which photolytically generate free radicals and have a carbon-carbonyl bond capable of cleavage at such bond to form two radicals, at least one of which is capable of photoinitiation; and a combination of a radical generating initiator which generates free radicals in combination with a spectral sensitizer.

17. The photosensitive element of claim 13 wherein the photopolymerizable compound comprises one or more components selected from the group consisting of an acrylamido modified cellulose acetate butyrate polymer and a pentaacrylate ester; and wherein the free radical generator comprises one or more compounds selected from the group consisting of aromatic ketones; benzoin; benzoin ethers; diphenyl-2,4,6-trimethyl benzoylphosphine oxide; bis(pentafluorophenyl)titanocene; triazines; thioxanthones in combination with a source of abstractable hydrogen; and one or more compounds selected from the group consisting of 2-methyl-1-[4-(methylthiophenyl]-2-morpholinopropanone; 2-benzyl-2-N,N-dimethylamino-1-(4 -morpholinophenyl)-1-butanone and benzophenone in combination with one or more compounds selected from the group consisting of 2-isopropylthioxanthanone and 4,4'-bisdiethylaminobenzophenone.

18. A method of producing an imaged article which comprises

A) preparing a photosensitive element by forming a light sensitive composition on a substrate, which light sensitive composition comprises:

(a) at least one photopolymerizable compound having at least two olefinically unsaturated double bonds, which photopolymerizable compound is present in an amount sufficient to photopolymerize in the presence of a free radical generating component which is capable of photoinitiation upon exposure to sufficient actinic radiation; and (b) at least one free radical generating component which is capable of photoinitiation, in an amount sufficient to effect photopolymerization of the photopolymerizable compound upon exposure to sufficient actinic radiation; and (c) benzanthrone in an amount sufficient to substantially prevent photopolymerization of the photopolymerizable compound when the light sensitive composition is exposed to actinic radiation below a threshold amount but to permit photopolymerization of the photopolymerizable compound when the light sensitive composition is exposed to actinic radiation above a threshold amount; and (d) at least one light sensitive diazonium compound; and B) imagewise exposing the photosensitive element to ultraviolet radiation to thereby produce imagewise exposed and unexposed non-image areas; and C) developing the photosensitive element by removing the unexposed non-image areas with a liquid developer.

19. The method of claim 18 wherein the photopolymerizable compound comprises one or more components selected from the group consisting of ethers, esters and partial esters of acrylic and methacrylic acid with an aromatic or aliphatic polyol; and wherein the free radical generator comprises one or more compounds selected from the group consisting of photoinitiators which photolytically generate free radicals and have a carbon-carbonyl bond capable of cleavage at such bond to form two radicals, at least one of which is capable of photoinitiation; and a combination of a radical generating initiator which generates free radicals in combination with a spectral sensitizer.

20. The method of claim 18 wherein the photopolymerizable compound comprises one or more components selected from the group consisting of an acrylamido modified cellulose acetate butyrate polymer and a pentaacrylate ester; and wherein the free radical generator comprises one or more compounds selected from the group consisting of aromatic ketones; benzoin; benzoin ethers; diphenyl-2,4,6-trimethyl benzoylphosphine oxide; bis(pentafluorophenyl)titanocene; triazines; thioxanthones in combination with a source of abstractable hydrogen; and one or more compounds selected from the group consisting of 2-methyl-1-[4-(methylthiophenyl]-2-morpholinopropanone; 2-benzyl-2-N,N-dimethylamino-1-(4-morpholinophenyl)-1-butanone and benzophenone in combination with one or more compounds selected from the group consisting of 2-isopropylthioxanthanone and 4,4'-bisdiethylaminobenzophenone.

* * * * *